United States Patent
Chang et al.

(10) Patent No.: US 12,075,614 B2
(45) Date of Patent: Aug. 27, 2024

(54) MIM MEMORY CELL WITH BACKSIDE INTERCONNECT STRUCTURES

(71) Applicant: Taiwan Semiconductor Manufacturing Company Ltd., Hsinchu (TW)

(72) Inventors: Meng-Sheng Chang, Chu-bei (TW); Chia-En Huang, Xinfeng Township (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 368 days.

(21) Appl. No.: 17/473,678

(22) Filed: Sep. 13, 2021

(65) Prior Publication Data

US 2022/0367489 A1 Nov. 17, 2022

Related U.S. Application Data

(60) Provisional application No. 63/188,164, filed on May 13, 2021.

(51) Int. Cl.
*H10B 20/20* (2023.01)
*H01L 23/525* (2006.01)
*H10B 20/25* (2023.01)

(52) U.S. Cl.
CPC ......... *H10B 20/20* (2023.02); *H01L 23/5256* (2013.01); *H10B 20/25* (2023.02)

(58) Field of Classification Search
CPC ...... H10B 20/20; H01L 23/5252; H01L 28/60
See application file for complete search history.

(56) References Cited

U.S. PATENT DOCUMENTS

| | | | |
|---|---|---|---|
| 8,203,175 B2 * | 6/2012 | Kuroda | H01L 27/1203 257/295 |
| 9,368,552 B2 * | 6/2016 | Lin | H01L 23/5226 |
| 10,763,269 B2 * | 9/2020 | Liaw | H01L 23/5226 |
| 2013/0134374 A1 * | 5/2013 | Kim | H10N 70/8822 257/2 |

* cited by examiner

*Primary Examiner* — Allison Bernstein
(74) *Attorney, Agent, or Firm* — FOLEY & LARDNER LLP

(57) ABSTRACT

A memory device is disclosed. The memory device includes a substrate having a first side and a second side that is opposite to the first side, and a transistor disposed on the first side of the substrate. The memory device includes a capacitor electrically connected to the transistor and including a first terminal, a second terminal, and an insulation layer interposed between the first and second terminals, at least the insulation layer disposed on the second side of the substrate. The transistor and the capacitor form a one-time programmable (OTP) memory cell.

19 Claims, 10 Drawing Sheets

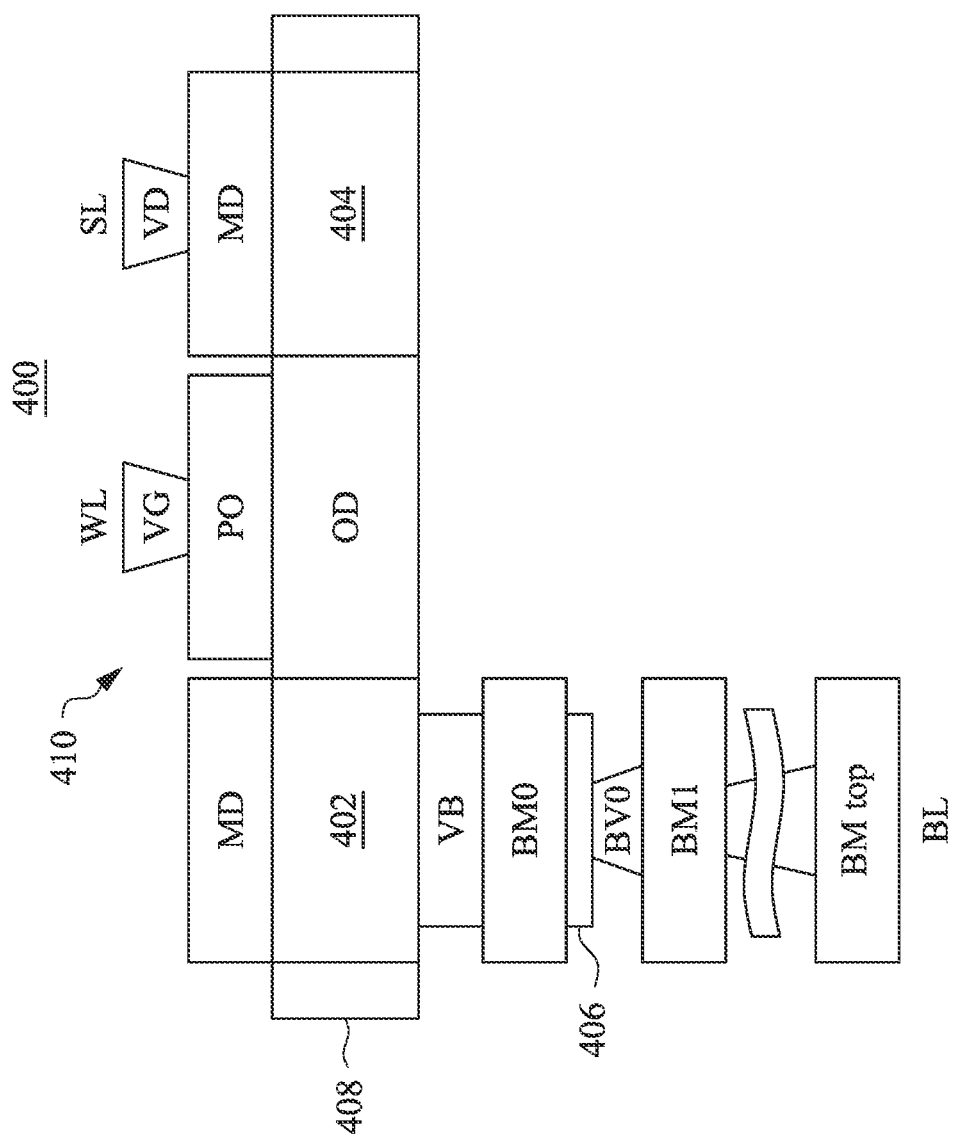

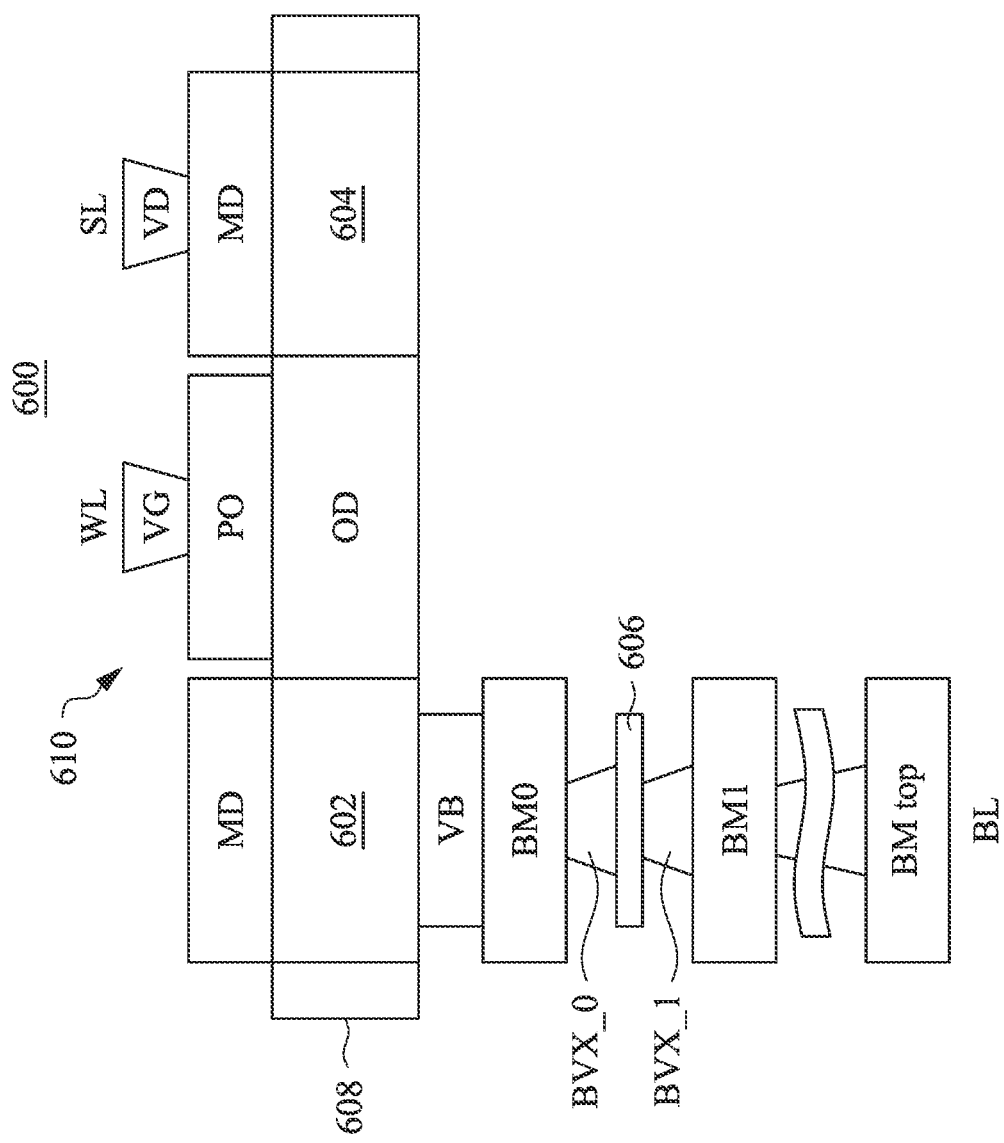

MIM MEMORY CELL WITH BACKSIDE INTERCONNECT STRUCTURES

CROSS-REFERENCE TO RELATED APPLICATION

This application claims priority to and the benefit of U.S. Provisional Application No. 63/188,164, filed May 13, 2021, entitled "NOVEL MIM MEMORY CELL WITH BACKSIDE POWER RAIL," which is incorporated herein by reference in its entirety for all purposes.

BACKGROUND

A one-time programmable (OTP) device is a type of non-volatile memory (NVM) often used for read-only memory (ROM). When the OTP device is programmed, the device cannot be reprogrammed. Common types include electrical fuses which use metal fuses (e.g., eFuse) and anti-fuse which uses gate dielectrics. One problem with typical OTP devices is high voltage endurance which causes degradation in the OTP device over time. As technology continues to advance and follow Moore's law, it is desirable to have devices that require low voltages and small cell areas.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4A illustrates a cross-sectional view of a memory cell, in accordance with some embodiments.

FIG. 4B illustrates a cross-sectional view of a portion of a memory cell, in accordance with some embodiments.

FIG. 6A illustrates a cross-sectional view of a memory cell, in accordance with some embodiments.

FIG. 6B illustrates a cross-sectional view of a portion of a memory cell, in accordance with some embodiments.

DETAILED DESCRIPTION

Figure 1:
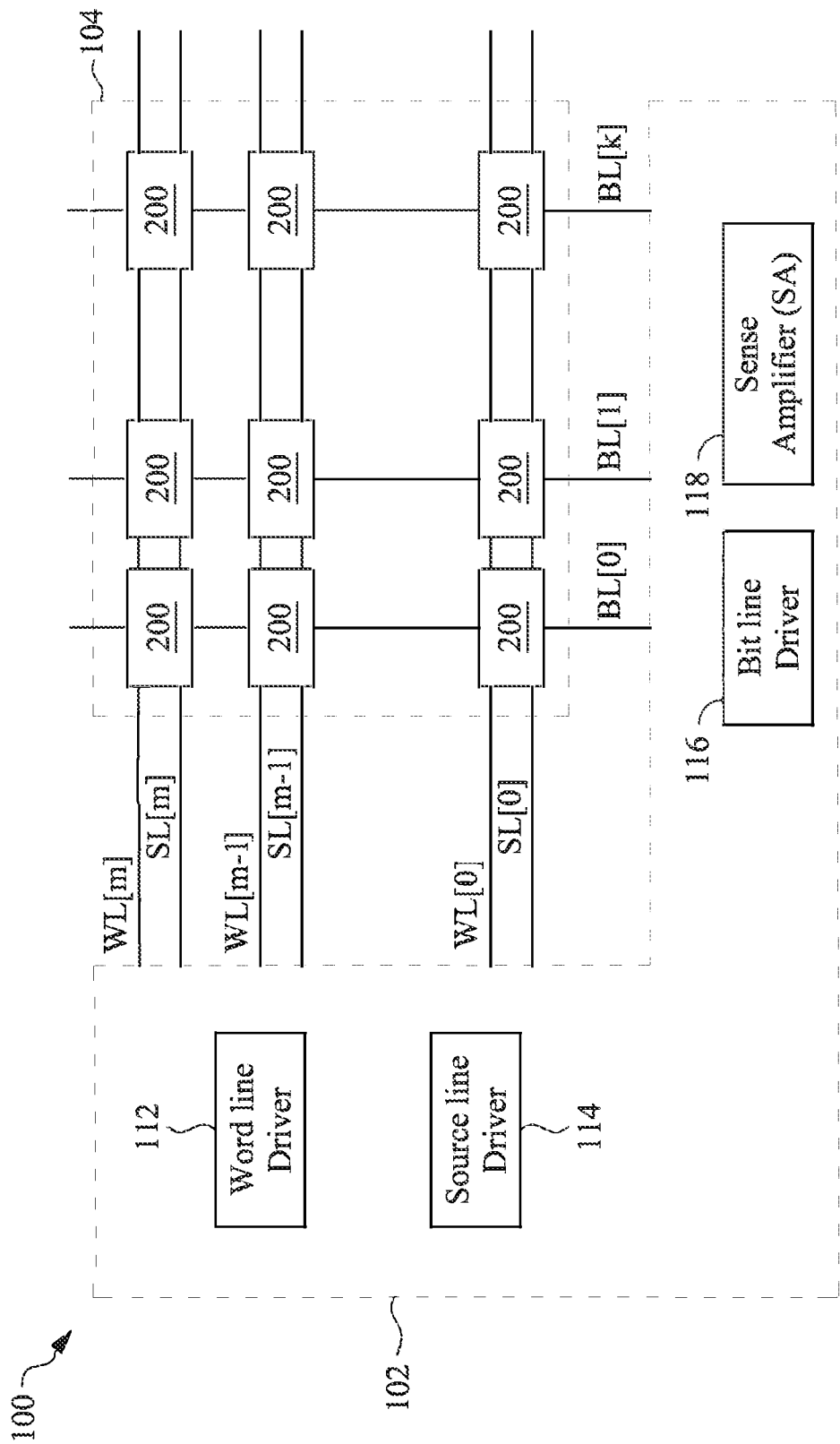
FIG. 1 illustrates a schematic block diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an OTP memory cell has a one-transistor-one-capacitor (1T1C) configuration having a capacitor and a transistor coupled in series between a bit line and ground. A gate terminal of the transistor is coupled to a word line. The capacitor is a metal-inter (or insulator)-metal (MIM) capacitor over the transistor. An insulating material of the capacitor is configured to break down under a predetermined break-down voltage or higher applied across the insulating material. When the insulating material is not yet broken down, the memory cell stores a first datum, e.g., logic "1." When the insulating material is broken down, the memory cell stores a second datum, e.g., logic "0."

In typical OTP memory cells, the capacitor is fabricated above the transistor during the middle-end-of-line (MEOL) or back-end-of-line (BEOL) processing. The interconnect network formed above the transistors have more inherent series resistance because there are many layers of the interconnect structures, via structures, and many layers of material formed throughout. This can lead to larger bit-cell areas, small read windows, and slower programming performances of the memory cells. One recent improvement is to form interconnect structures (e.g., power rails) on the backside of a wafer in order to reduce the standard cell height of semiconductor devices and therefore reduce the inherent series resistance. In the present disclosure, the insulation layer of the MIM capacitor in the OTP memory cell is formed on the backside. This can advantageously reduce a current path between the bit line and the MIM capacitor. Furthermore, the bit-cell area of the OTP memory can be reduced because the insulation layer is disposed directly between the backside interconnect structures and backside vias, advantageously reducing the area needed for the insulation material. Also, the read window of the OTP memory cell can be advantageously increased.

FIG. 1 is a schematic block diagram of a memory device 100, in accordance with some embodiments. A memory device is a type of an IC device. In at least one embodiment, a memory device is an individual IC device. In some embodiments, a memory device is included as a part of a larger IC device which comprises circuitry other than the memory device for other functionalities.

The memory device 100 comprises at least one memory cell 200 and a controller (also referred to as "control circuit") 102 coupled to control an operation of the memory cell 200. In the example configuration in FIG. 1, the memory device 100 comprises a plurality of memory cells 200 arranged in a plurality of columns and rows in a memory array 104. The memory device 100 further comprises a plurality of word lines WL_0 to WL_m extending along the rows, a plurality of source lines SL_0 to SL_m extending along the rows, and a plurality of bit lines (also referred to as "data lines") BL_0 to BL_k extending along the columns of the memory cells 200. Each of the memory cells 200 is coupled to the controller 102 by at least one of the word lines, at least one of the source lines, and at least one of the bit lines. Examples of word lines include, but are not limited to, read word lines for transmitting addresses of the memory cells 200 to be read from, write word lines for transmitting addresses of the memory cells 200 to be written to, or the like. In at least one embodiment, a set of word lines is configured to perform as both read word lines and write word lines. Examples of bit lines include read bit lines for transmitting data read from the memory cells 200 indicated by corresponding word lines, write bit lines for transmitting data to be written to the memory cells 200 indicated by corresponding word lines, or the like. In at least one embodiment, a set of bit lines is configured to perform as both read bit lines and write bit lines. In one or more embodiments, each memory cell 200 is coupled to a pair of bit lines referred to as a bit line and a bit line bar. The word lines are commonly referred to herein as WL, the source lines are commonly referred to herein as SL, and the bit lines are commonly referred to herein as BL. Various numbers of word lines and/or bit lines and/or source lines in the memory device 100 are within the scope of various embodiments. In at least one embodiment, the source lines SL are arranged in the columns, rather than in the rows as shown in FIG. 1. In at least one embodiment, the source lines SL are omitted.

In the example configuration in FIG. 1, the controller 102 comprises a word line driver 112, a source line driver 114, a bit line driver 116, and a sense amplifier (SA) 118 which are configured to perform at least one of a read operation or a write operation. In at least one embodiment, the controller 102 further includes one or more clock generators for providing clock signals for various components of the memory device 100, one or more input/output (I/O) circuits for data exchange with external devices, and/or one or more controllers for controlling various operations in the memory device 100. In at least one embodiment, the source line driver 114 is omitted.

The word line driver 112 is coupled to the memory array 104 via the word lines WL. The word line driver 112 is configured to decode a row address of the memory cell 200 selected to be accessed in a read operation or a write operation. The word line driver 112 is configured to supply a voltage to the selected word line WL corresponding to the decoded row address, and a different voltage to the other, unselected word lines WL.

The source line driver 114 is coupled to the memory array 104 via the source lines SL. The source line driver 114 is configured to supply a voltage to the selected source line SL corresponding to the selected memory cell 200, and a different voltage to the other, unselected source lines SL.

The bit line driver 116 (also referred as "write driver") is coupled to the memory array 104 via the bit lines BL. The bit line driver 116 is configured to decode a column address of the memory cell 200 selected to be accessed in a read operation or a write operation. The bit line driver 116 is configured to supply a voltage to the selected bit line BL corresponding to the decoded column address, and a different voltage to the other, unselected bit lines BL. In a write operation, the bit line driver 116 is configured to supply a write voltage (also referred to as "program voltage") to the selected bit line BL. In a read operation, the bit line driver 116 is configured to supply a read voltage to the selected bit line BL.

The SA 118 is coupled to the memory array 104 via the bit lines BL. In a read operation, the SA 118 is configured to sense data read from the accessed memory cell 200 and retrieved through the corresponding bit lines BL. The described memory device configuration is an example, and other memory device configurations are within the scopes of various embodiments. In at least one embodiment, the memory device 100 is an OTP non-volatile memory, and the memory cells 200 are OTP memory cells. Other types of memory are within the scopes of various embodiments. Example memory types of the memory device 100 include, but are not limited to, eFuse, anti-fuse, magnetoresistive random-access memory (MRAM), or the like.

Figure 2:
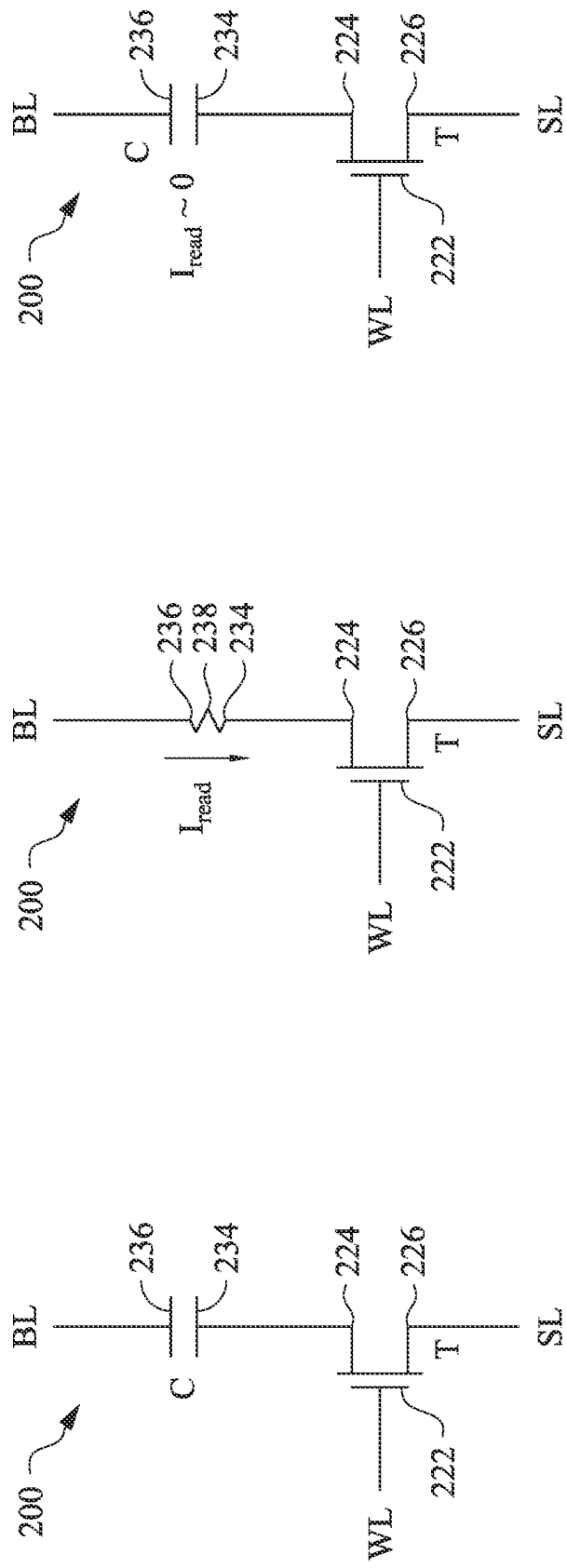
FIGS. 2A, 2B, and 2C are schematic circuit diagrams of a memory cell in various operations, in accordance with some embodiments.

FIGS. 2A-2C are schematic circuit diagrams of a memory cell 200 in various operations, in accordance with some embodiments. In at least one embodiment, the memory cell 200 corresponds to at least one of the memory cells 200 in the memory device 100.

In FIG. 2A, the memory cell 200 comprises a capacitor C and a transistor T. The transistor T has a gate terminal 222 coupled to a word line WL, a first terminal 224, and a second terminal 226. The capacitor C has a first end 234 coupled to the first terminal 224 of the transistor T, a second end 236 coupled to a bit line BL, and an insulating material (not shown in FIG. 2A) between the first end 234 and the second end 236. The insulating material is configured to break down under a predetermined break-down voltage or higher applied between the first end 234 and the second end 236.

In the example configuration in FIG. 2A, the second terminal 226 is coupled to a source line SL. In other words, the capacitor C and the transistor T are coupled in series between the bit line BL and the source line SL. In at least one embodiment, the word line WL corresponds to at least one of the word lines WL in the memory device 100, the source line SL corresponds to at least one of the source lines SL in the memory device 100, and the bit line BL corresponds to at least one of the bit lines BL in the memory device 100. In at least one embodiment, the source line SL is omitted, and the second terminal 226 is coupled to a node of a predetermined voltage. Examples of a predetermined voltage include, but are not limited to, a ground voltage VSS, a positive power supply voltage VDD, or the like.

Examples of the transistor T include, but are not limited to, metal oxide semiconductor field effect transistors (MOSFET), complementary metal oxide semiconductors (CMOS) transistors, P-channel metal-oxide semiconductors (PMOS), N-channel metal-oxide semiconductors (NMOS), bipolar junction transistors (BJT), high voltage transistors, high frequency transistors, P-channel and/or N-channel field effect transistors (PFETs/NFETs), FinFETs, planar MOS transistors with raised source/drains, nanosheet FETs, nanowire FETs, or the like. The first terminal 224 is a source/drain (S/D) of the transistor T, and the second terminal 226 is another source/drain of the transistor T. In the example configuration described with respect to FIG. 2A, the transistor T is an NMOS transistor, the first terminal 224 is a drain and the second terminal 226 is a source of the transistor T. Other configurations including PMOS transistors instead of NMOS transistors are within the scopes of various embodiments.

An example of the capacitor C includes, but is not limited to, an MIM capacitor. Other capacitor configurations, e.g., MOS capacitor, are within the scopes of various embodiments. An MIM capacitor comprises a lower electrode corresponding to one of the first end 234 or the second end 236, an upper electrode corresponding to the other of the first end 234 or the second end 236, and the insulating material sandwiched between the lower electrode and the upper electrode. Example materials of the insulating material include, but are not limited to, silicon dioxide, ZrO, $TiO_2$, HfOx, a high-k dielectric, or the like. Examples of high-k dielectrics include, but are not limited to, zirconium dioxide, hafnium dioxide, zirconium silicate, hafnium silicate, or the like. In at least one embodiment, the insulating material of the capacitor C is the same as or similar to a gate dielectric included in a transistor, such as the transistor T. In at least one embodiment, the transistor T is formed over a semiconductor substrate in a front-end-of-line (FEOL) processing, and then the capacitor C is formed as an MIM capacitor in a BEOL processing over the transistor T.

In some embodiments, operations of the memory cell 200 are controlled by a controller, such as the controller 102 of the memory device 100. For example, when the memory cell 200 is selected in a programming operation (also referred to as "write operation"), the controller 102 is configured to apply a turn-ON voltage via the word line WL to the gate terminal 222 of the transistor T to turn ON the transistor T. The controller 102 is further configured to apply a program voltage via the bit line BL to the second end 236 of the capacitor C, and apply a ground voltage VSS to the source line SL. In at least one embodiment, the source line SL is grounded at all times. While the transistor T is turned ON by the turn-ON voltage and electrically couples the first end 234 of the capacitor C to the ground voltage VSS on the source line SL, the program voltage applied to the second end 236 from the bit line BL causes a predetermined break-down voltage or higher to be applied between the first end 234 and the second end 236 of the capacitor C. As a result, a short circuit occurs in the insulating material of the capacitor C under the applied break-down voltage or higher. In other words, the insulating material is broken down and becomes a resistive structure, for example, as described with respect to FIG. 2B. The broken-down insulating material corresponds to a first datum, or a first logic value, stored in the memory cell 200. In at least one embodiment, the first datum corresponding to the broken-down insulating material is logic "0."

When the memory cell 200 is not selected in a programming operation, the controller 102 is configured to not apply at least one of the turn-ON voltage, the program voltage, or the ground voltage VSS to the corresponding gate terminal 222, bit line BL or source line SL. As result, the insulating material of the capacitor C is not broken down, and the capacitor C remains a capacitive structure, for example, as described with respect to FIG. 2C. The insulating material not yet broken down corresponds to a second datum, or a second logic value, stored in the memory cell 200. In at least one embodiment, the second datum corresponding to the insulating material not yet broken down is logic "1."

When the memory cell 200 is selected in a read operation, the controller 102 is configured to apply a turn-ON voltage via the word line WL to the gate terminal 222 of the transistor T to turn ON the transistor T. The controller 102 is further configured to apply a read voltage via the bit line BL to the second end 236 of the capacitor C, and apply a ground voltage VSS to the source line SL. In at least one embodiment, the source line SL is grounded at all times. While the transistor T is turned ON by the turn-ON voltage and electrically couples the first end 234 of the capacitor C to the ground voltage VSS on the source line SL, the controller 102 is configured to sense, e.g., by using the SA 118, a current flowing in the memory cell 200 to detect the datum stored in the memory cell 200.

In FIG. 2B, when the memory cell 200 has been previously programmed to store logic "0," the insulating material of the capacitor C has been broken down and become a resistive structure 238, the read voltage applied to the bit line BL causes a current $I_{read}$ to flow through the resistive structure 238 and the turned-ON transistor T to the ground voltage VSS at the source line SL. The SA 118 is configured to sense the current $I_{read}$. The controller 102 is configured to detect, based on the sensed current $I_{read}$, that the memory cell 200 stores logic "0."

In FIG. 2C, when the memory cell 200 has been not previously programmed, the memory cell 200 stores logic "1," the insulating material of the capacitor C is not yet broken down, and the capacitor C remains a capacitive structure. The read voltage applied to the bit line BL is lower than the breakdown voltage, and causes no current, or a current $I_{read}$ close to zero, to flow through the capacitor C and the turned-ON transistor T to the ground at the source line SL. The SA 118 is configured to sense that there is no current, or a current $I_{read}$ close to zero, that flows through the memory cell 200. Accordingly, the controller 102 is configured to detect that the memory cell 200 stores logic "1."

In at least one embodiment, the turn-ON voltage in the program operation is the same as the turn-ON voltage in the read operation. Other configurations where different turn-ON voltages are applied in different operations are within the scopes of various embodiments. The read voltage is lower than the program voltage. In at least one embodiment, the program voltage is about 1.2 V or less, the breakdown voltage is about 1.2 V, and the read voltage is about 0.75 V. Other voltage schemes are within the scopes of various embodiments.

In some embodiments, memory cells having the described 1T1C configuration make it possible to achieve one or more advantages over other approaches including, but not limited to, smaller chip area (i.e., the area occupied by the memory cell on a wafer), lower program voltage, lower disturb voltage, improved reliability, enhanced data security, or the like.

Figure 3:
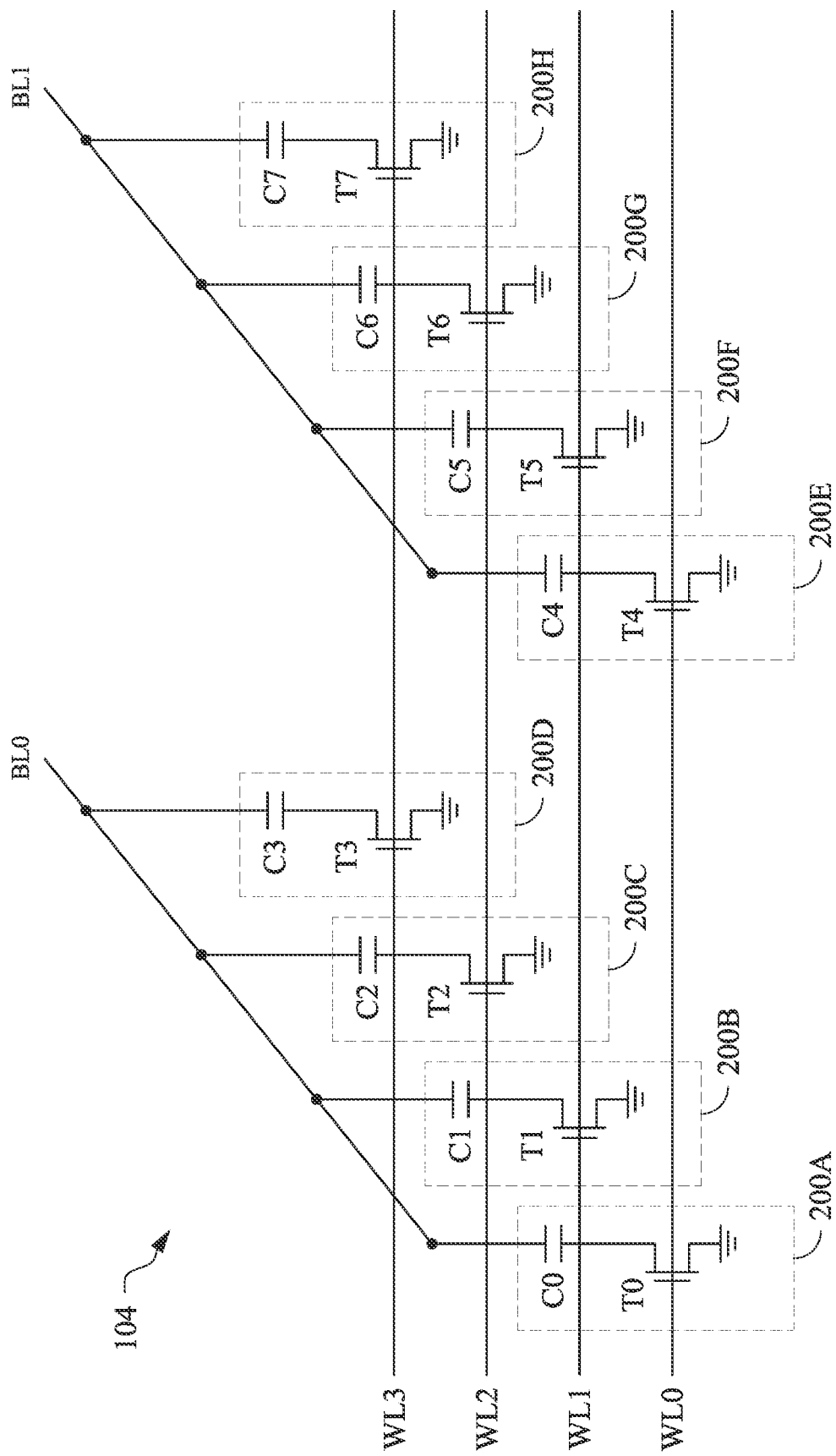
FIG. 3 is a schematic circuit diagram of a memory device, in accordance with some embodiments.

FIG. 3 is a schematic circuit diagram of a portion of the memory array 104 (FIG. 1), in accordance with some embodiments. As shown, the memory array 104 comprises a plurality of memory cells 200, e.g., 200A, 200B, 200C, 200D, 200E, 200F, 200G, and 200H. Although eight memory cells are shown in FIG. 3, it should be understood that the memory array 104 can include any number of memory cells 200, while remaining within the scope of present disclosure.

Each of the memory cells 200A-200H has a 1T1C configuration of the memory cell 200 with the source line SL grounded and comprises a transistor and a capacitor coupled in series between a corresponding bit line and the ground. For example, the memory cells 200A-200H correspondingly comprise capacitors C0, C1, . . . C7, and transistors T0, T1, . . . T7. The capacitors C0, C1, C2, C3 of the memory cells 200A-200D are commonly coupled to a bit line BL0. Gate terminals of the transistors T0, T1, T2, T3 are correspondingly coupled to word lines WL0, WL1, WL2, WL3. The capacitors C4, C5, C6, C7 of the memory cells 200E-200H are commonly coupled to a bit line BL1. Gate terminals of the transistors T4, T5, T6, T7 are correspondingly coupled to the word lines WL0, WL1, WL2, WL3. The memory cells 200A-200D commonly coupled to the bit line BL0 correspond to a first string of memory cells, and the memory cells 200E-200H commonly coupled to the bit line BL1 correspond to a second string of memory cells. In at least one embodiment, each of the memory cells 200A-200H corresponds to a memory cell 200, each of the bit lines BL0, BL1 corresponds to a bit line BL, and each of the word lines WL0, WL1, WL2, WL3 corresponds to a word line WL in the memory device 100. In at least one embodiment, one or more advantages described herein are achievable in the memory array 104.

FIG. 4A illustrates a cross-sectional view of a memory cell 400 (e.g., memory cell 200), in accordance with some embodiments. The memory cell 400 includes a transistor 410 (e.g., transistor T) formed on a first side of a substrate 408, and a capacitor (e.g., capacitor C) including an insulation layer 406 formed on a second side (opposite to the first side) of the substrate 408.

In this disclosure, the memory cells include a plurality of backside metallization layers and backside via structures that are stacked over an S/D structure (e.g., S/D structure 402). The backside metallization layer (or interconnect structure) refers to a layer formed during the BEOL process in which multiple metal or interconnect structures are formed and laterally separated from each other by interlayer dielectric (ILD). A top surface and a bottom surface of the ILD can define a boundary of the metallization layer. In the memory cell 400, for example, the backside metallization layers in the memory cell 400 include interconnect structures BM0, BM1 . . . BMtop, which are each formed in their respective metallization layers. Although a certain number of backside interconnect structures are formed in FIG. 4A, embodiments are not limited thereto, and fewer or more metallization layers and backside interconnect structures can be formed. Furthermore, a plurality of backside vias structures VB, BV0 . . . BVtop are formed over the S/D structure 402 and electrically connected to adjacent interconnect structures. For example, the backside via structure BV1 is electrically connects the backside interconnect structure BM1 to the backside interconnect structure BM2, the via structure BV2 electrically connects the backside interconnect structure BM2 to the backside interconnect structure BM3, and so on and so forth.

The transistor 410 includes a gate structure PO, an S/D structure 402 (e.g., first terminal 224), and an S/D structure 404 (e.g., second terminal 226). The gate structure PO is electrically connected to the word line WL, the S/D structure 404 is electrically connected to the source line SL, and the S/D structure 402 is electrically connected to the bit line BL through a plurality of via structures and backside interconnect structures.

The insulation layer 406 is disposed between the backside interconnect structure BM0 and the backside via structure BV0. Specifically, the insulation layer 406 is disposed below a bottom surface of the backside interconnect structure BM0 and a top surface of the backside via structure BV0. Accordingly, the capacitor of the memory cell 400 includes a first terminal, including the backside interconnect structure BM0 and the backside via structure VB, a second terminal including backside via structure BV0, backside interconnect structure BM1, etc. disposed below the insulation layer 406, and the insulation layer 406 between the first and second terminals. The first terminal is electrically connected to the S/D structure 402, and the second terminal is electrically connected to the bit line BL. Accordingly the capacitor of the memory cell 400 is disposed on a backside of the substrate 408.

FIG. 4B illustrates a cross-sectional view of a portion of a memory cell 450, in accordance with some embodiments. For simplicity and clarity, only the backside interconnect structures BMX, BMX+1, the via structure BVX, and the insulation layer 406 are shown. The memory cell 450 is a generalized version of a disclosed memory cell (the memory cell 400) in which the insulation layer 406 is disposed between a non-specific backside interconnect structure BMX and a non-specific backside via structure BVX disposed below the backside interconnect structure BMX with only the insulation layer 406 therebetween. For example, the "X" in "BMX" and "BVX" can be 0, 1, 2, etc. such that insulation layer 406 is formed on a bottom surface of the backside interconnect structure BMX and a top surface of the backside via structure BVX. The backside interconnect structure BMX can be part of the first terminal (e.g., first terminal 224) of the capacitor (e.g., capacitor C), and the backside via structure BVX can be part of the second terminal (e.g., second terminal 226) of the capacitor.

Figure 4C:
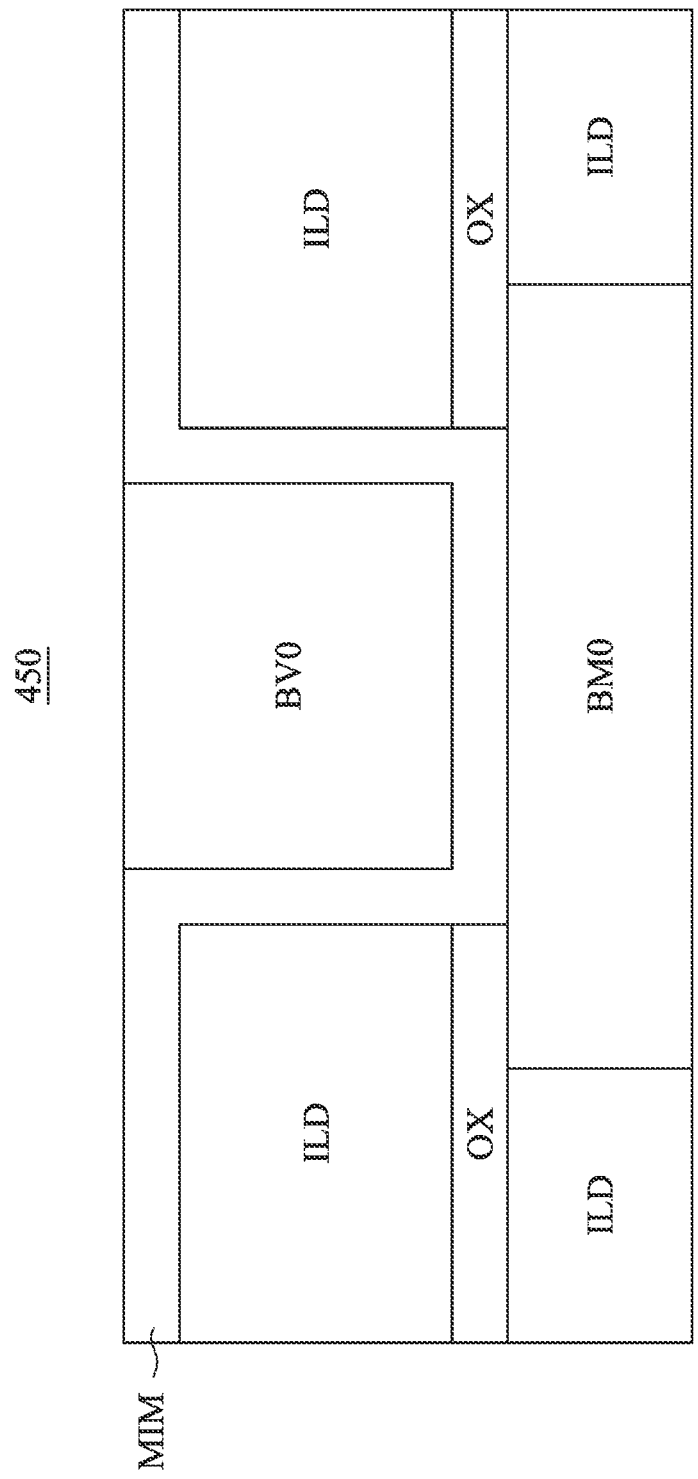
FIG. 4C illustrates a more detailed cross-sectional view of the portion of the memory cell of FIG. 4B, in accordance with some embodiments.

FIG. 4C illustrates a more detailed cross-sectional view of the portion of the memory cell 450 of FIG. 4B, in accordance with some embodiments. The portion shown in FIG. 4C includes oxide layers OX, interlayer dielectric ILD, backside interconnect structure BM0, backside via structure BV0, and the insulation layer MIM (e.g., insulation layer 406). The portion in FIG. 4C is flipped around relative to the portion shown in FIG. 4B to show how the layers are stacked on top of one another on a backside side of the substrate. Accordingly, even though the backside via structure BV0 is located above the backside interconnect structure BM0 in FIG. 4C, the backside via structure BV0 is located farther than the backside interconnect structure BM0 from the substrate. Furthermore, even though the backside interconnect structure and backside via structure of FIG. 4C are BM0 and BV0, respectively, embodiments are not limited thereto. For example, the backside interconnect structure can be BM1, BM2, . . . BMX and/or the backside via structure can be VB, BV1, . . . BVX.

The backside interconnect structure BM0 can be formed of at least one of W, TiN, TaN, Ru, Co, Al, Cu, or any conductive material. The oxide OX can be formed of insulating material including, but not limited to, silicon dioxide, silicate glass, silicon oxycarbide, ZrO, $TiO_2$, HfOx, a high-k dielectric, or the like. The ILD can be formed of porous low-k dielectric material, such as silicon oxide, phosphosilicate glass (PSG), borosilicate glass (BSG), boron-doped phosphosilicate glass (BPSG), undoped silicate glass (USG), or the like, and may be deposited by any suitable method, such as CVD, PECVD, or FCVD. The insulation layer MIM can be formed of any suitable insulator material, for example, $SiO_2$, SiN, $Al_2O_3$, HfO, TaO, TiN, W, Ru, Co, Al, Cu, and the like, and/or any combination thereof. The backside via structure BV0 may be formed of at least one of W, TiN, TaN, Ru, Co, Al, Cu, or any conductive material.

As discussed above, the backside via structure BV0 can function as (or a portion of) a first or second terminal of the capacitor of the memory cell 500, and the backside interconnect structure BM0 can function as (or a portion of) the other one of the first or second terminal of the capacitor of the memory cell 500.

Figures 5A, 5B:
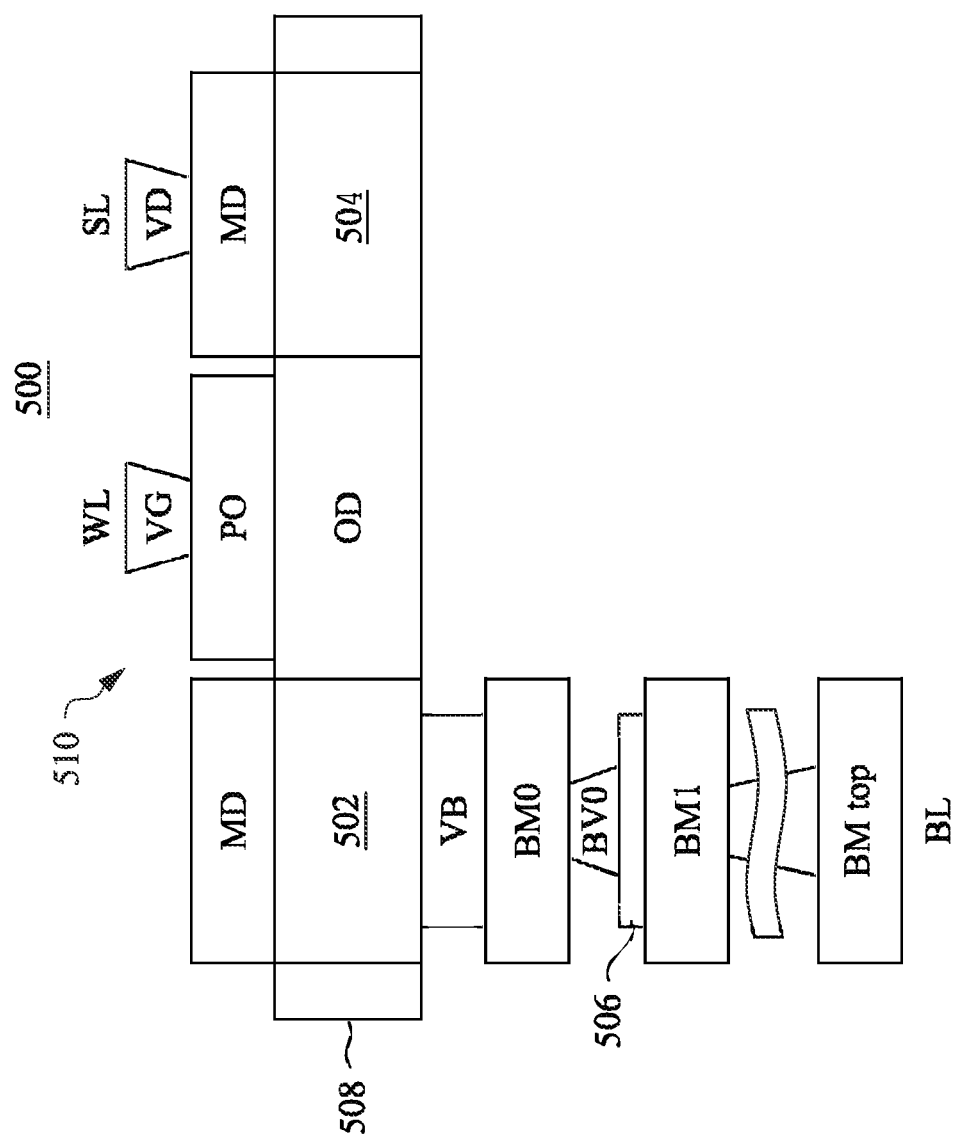
FIG. 5A illustrates a cross-sectional view of a memory cell, in accordance with some embodiments.
FIG. 5B illustrates a cross-sectional view of a portion of a memory cell, in accordance with some embodiments.

FIG. 5A illustrates a cross-sectional view of a memory cell 500, in accordance with some embodiments. The memory cell 500 includes a transistor 510 (e.g., transistor T) disposed on a first side of a substrate 508, and a capacitor (e.g., capacitor C) including an insulation layer 506 disposed on a second side (or opposite side) of the substrate 508. The memory cell 500 is similar to the memory cell 400 of FIG. 4A except that the location of the insulation layer 506 in FIG. 5A is different than the location of the insulation layer 406 in FIG. 4A.

The transistor 510 includes a gate structure PO, an S/D structure 502 (e.g., first terminal 224), and an S/D structure 504 (e.g., second terminal 226). The gate structure PO is electrically connected to the word line WL, the S/D structure 504 is electrically connected to the source line SL, and the S/D structure 502 is electrically connected to the bit line BL through a plurality of via structures and backside interconnect layers.

The insulation layer 506 is disposed between the backside via structure BV0 and the backside interconnect structure BM1. Specifically, the insulation layer 506 is disposed below a bottom surface of the backside via structure BV0 and a top surface of the backside interconnect structure BM1. Accordingly, the capacitor of the memory cell 500 includes a first terminal, including the backside via structure BV0, the backside interconnect structure BM0 and the backside via structure VB, a second terminal including backside interconnect structure BM1, etc. disposed below the insulation 506, and the insulation layer 506 between the first and second terminals. The first terminal is electrically connected to the S/D structure 502, and the second terminal is electrically connected to the bit line BL.

FIG. 5B illustrates a cross-sectional view of a portion of a memory cell 550, in accordance with some embodiments. For simplicity and clarity, only backside interconnect structures BMX, BMX+1, via structure BVX, and the insulation layer 506 is shown. The memory cell 550 is a generalized version of the memory cell 500 in which the insulation layer 506 is disposed between a non-specific backside via structure BVX and a non-specific backside interconnect structure BMX+1 disposed below the backside via structure BVX with only the insulation layer 506 therebetween. For example, the "X" in "BMX" and "BVX" can be 0, 1, 2, etc. such that insulation layer 506 is formed on a bottom surface of the backside via structure BVX and a top surface of the backside interconnect structure BMX+1. The backside via structure BVX can be part of the first terminal (e.g., first terminal 224) of the capacitor (e.g., capacitor C), and the backside interconnect structure BMX+1 can be part of the second terminal (e.g., second terminal 226) of the capacitor.

FIG. 6A illustrates a cross-sectional view of a memory cell 600, in accordance with some embodiments. The memory cell 600 includes a transistor 610 (e.g., transistor T) disposed on a first side of a substrate 608 and a capacitor (e.g., capacitor C) including an insulation layer 606 disposed on a second side (or opposite side) of the substrate 608. The memory cell 600 is similar to the memory cell 500 of FIG. 5A except that the location of the insulation layer 606 in FIG. 6A is different than the location of the insulation 506 in FIG. 5A.

The transistor 610 includes a gate structure PO, an S/D structure 602 (e.g., first terminal 224), and an S/D structure 604 (e.g., second terminal 226). The gate structure PO is electrically connected to the word line WL, the S/D structure 604 is electrically connected to the source line SL, and the S/D structure 602 is electrically connected to the bit line BL through a plurality of via structures and backside interconnect layers.

The insulation layer 606 is disposed within the backside via structure BV0, which includes a first (top) portion BV0_0 and a second (bottom) portion BV0_1. Specifically, the insulation layer 606 is disposed below a bottom surface of the first portion BV0_0 of the backside via structure BV0 and a top surface of the second portion BV0_1 of the backside via structure BV0. Accordingly, the capacitor of the memory cell 600 includes a first terminal, including the top portion BV0_0, the backside interconnect structure BMO and the backside via structure VB, a second terminal including the second portion BV0_1, the backside interconnect structure BM1, etc. disposed below the insulation layer 606, and the insulation layer 606 between the first and second terminals. The first terminal is electrically connected to the S/D structure 602, and the second terminal is electrically connected to the bit line BL.

FIG. 6B illustrates a cross-sectional view of a portion of a memory cell 650, in accordance with some embodiments. For simplicity and clarity, only backside interconnect structures BMX, BMX+1, via structure BVX, and the insulation layer 606 is shown. The memory cell 650 is a generalized version of the memory cell 600 in which the insulation layer 606 is disposed between a first portion BVX_0 and a second portion BVX_1 of a non-specific backside via structure BVX. For example, the "X" in "BMX" and "BVX" can be 0, 1, 2, etc. such that insulation layer 606 is formed on a bottom surface of the first portion BVX_0 and a top surface of the second portion BVX_1. The first portion BVX_0 can be part of the first terminal (e.g., first terminal 224) of the capacitor (e.g., capacitor C), and the second portion BVX_1 can be part of the second terminal (e.g., second terminal 226) of the capacitor.

Figure 7C:
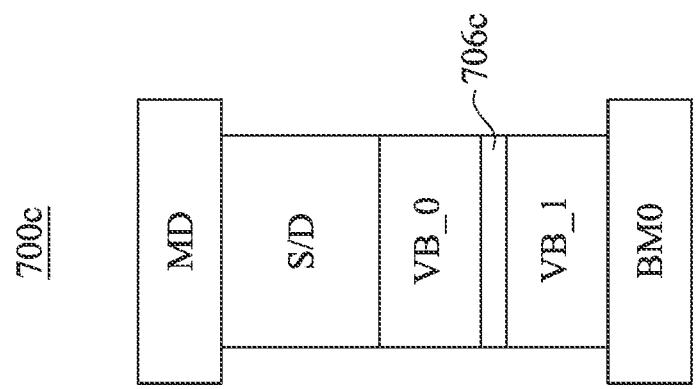
FIGS. 7A, 7B, and 7C each illustrates a cross-sectional view of a portion of memory cells, in accordance with some embodiments.
Figure 7B:
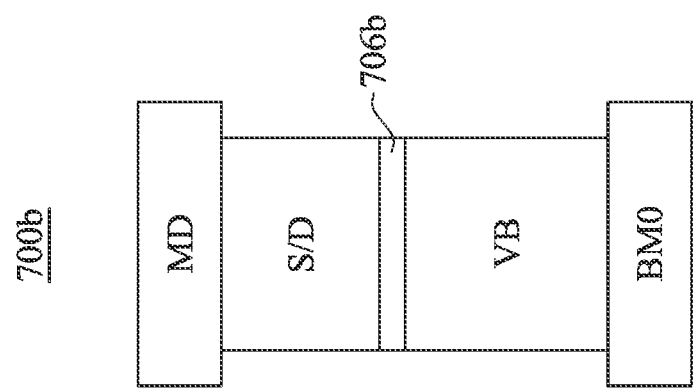
Figure 7A:
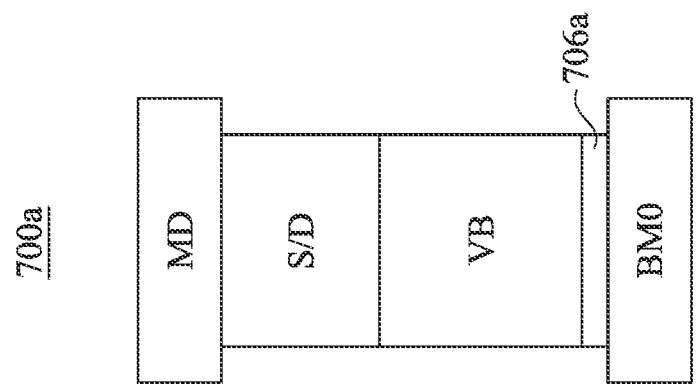

FIGS. 7A-7C each illustrates a cross-sectional view of a portion of memory cells 700a, 700b, and 700c, respectively, in accordance with some embodiments. Each of the memory cells 700a, 700b, and 700c is similar to the memory cells 400, 500, or 600, except the location of insulation layer 706a of the capacitor is different with respect to the backside via structure VB. For example, in FIG. 7A, the memory cell 700a includes the insulation layer 706a between the backside via structure VB and the backside interconnect structure BM0. For example, in FIG. 7B, the memory cell 700b includes the insulation layer 706b between an S/D structure and the backside via structure VB. For example, in FIG. 7C, the memory cell 700c includes the insulation layer 706c between a top portion VB_0 of the backside via structure VB and a bottom portion VB_1 of the backside via structure VB.

Figure 8C:
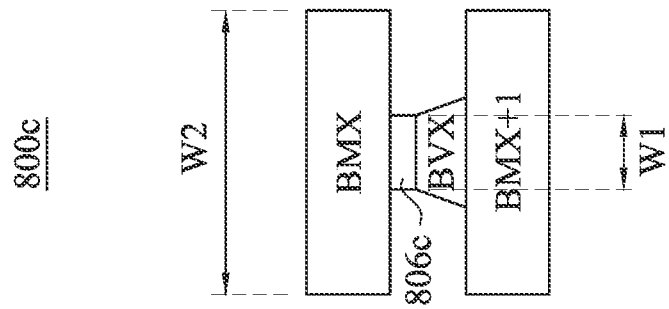
FIGS. 8A, 8B, and 8C each illustrates a cross-sectional view of a portion of a memory cell, in accordance with some embodiments.
Figure 8B:
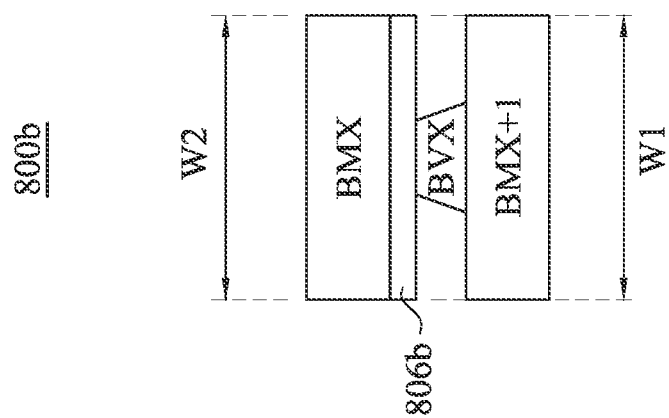
Figure 8A:
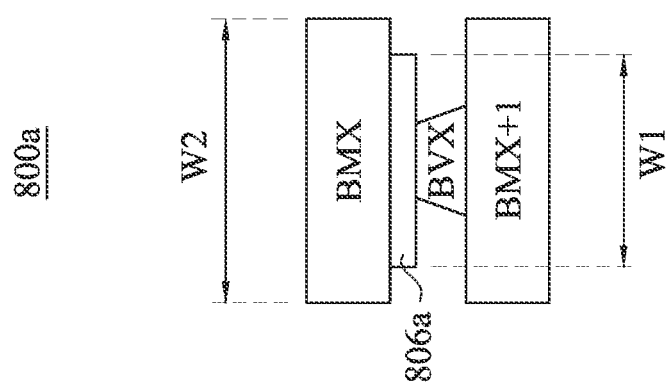

FIGS. 8A-8C each illustrates a cross-sectional view of a portion of a memory cell 800a, 800b, and 800c (e.g., memory cell 400, 450), in accordance with some embodiments. The portions include the backside interconnect structure BMX, the insulation layer 806a/806b/806c, the backside via BVX, and the backside interconnect structure BMX+1. Each of the insulation layers 806a-806c has a width W1. The interconnect structure BMX has a bottom surface with a width W2. In the memory cell 800b, W2 is substantially the same as W1. In the memory cells 800a and 800b, W1 is less than W2. In the memory cell 800a, the ratio between the W1 and W2 is about 0.6, whereas the ratio is about 0.2 in the memory cell 800c. However, the ratios are not limited thereto. For example, the ratio can be any number between 0 and 1.

Figure 9C:
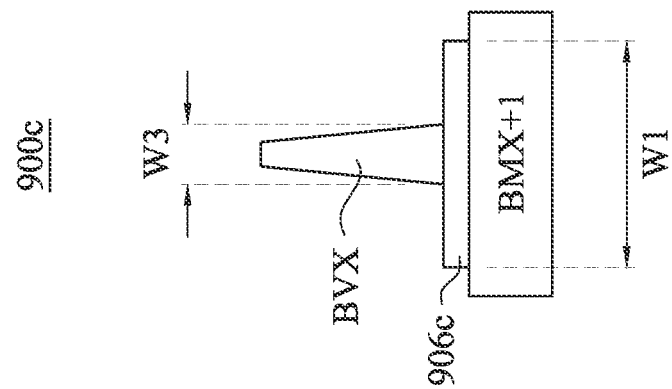
FIGS. 9A, 9B, and 9C each illustrates a cross-sectional view of a portion of a memory cell, in accordance with some embodiments.
Figure 9B:
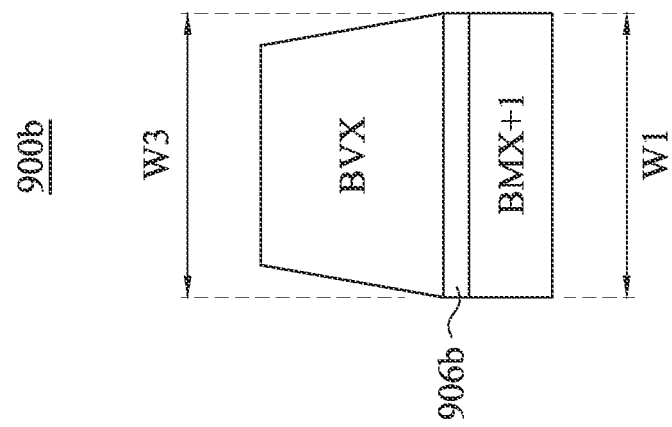
Figure 9A:
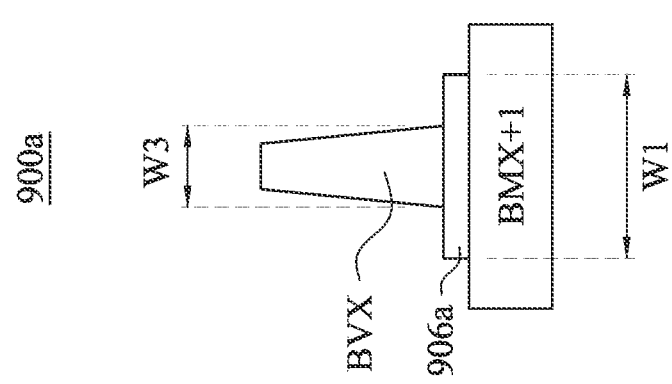

FIGS. 9A-9C each illustrates a cross-sectional view of a portion of a memory cell 900a, 900b, and 900c (e.g., memory cell 500, 550), in accordance with some embodiments. The portions include the backside via BVX, the insulation layer 906a/906b/906c, and the backside interconnect structure BMX+1. Each of the insulation layers 906a-906c has a width W1. The backside via BVX has a bottom surface with a width W3. In the memory cell 900b, W3 is substantially the same as W1. In the memory cells 900a and 900b, W1 is less than W3. In the memory cell 900a, the ratio between the W3 and W1 is about 0.6, whereas the ratio is about 0.2 in the memory cell 900c. However, the ratios are not limited thereto. For example, the ratio can be any number between 0 and 1.)

In one aspect of the present disclosure, a memory device is disclosed. The memory device includes a substrate having a first side and a second side that is opposite to the first side; a transistor disposed on the first side of the substrate; a capacitor electrically connected to the transistor and including a first terminal, a second terminal, and an insulation layer interposed between the first and second terminals, at least the insulation layer disposed on the second side of the substrate. The transistor and the capacitor form an OTP memory cell.

In another aspect of the present disclosure, a memory array is disclosed. The memory array includes a substrate; and a plurality of OTP memory cells disposed over the substrate. Each OTP memory cell includes a transistor disposed on a substrate and having a source/drain terminal; a plurality of via structures disposed below the source/drain terminal of the transistor; a plurality of interconnect structures disposed below the source/drain terminal of the transistor, where one of the plurality of interconnect structures is interposed between adjacent via structures of the plurality of via structures; and an insulation layer interposed between a first via structure of the plurality of via structures and a first interconnect structure of the plurality of interconnect structures.

In yet another aspect of the present disclosure, a memory array is disclosed. The memory array includes a plurality of OTP memory cells, each OTP memory cell comprising: a first active region comprising a plurality of epitaxial structures; an interconnect structure disposed below the first active region, wherein at least one of the plurality of epitaxial structures is electrically coupled to the interconnect structure; and an insulation layer disposed between the plurality of epitaxial structures and the interconnect structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a substrate having a first side and a second side that is opposite to the first side;
a transistor disposed on the first side of the substrate; and
a capacitor electrically connected to the transistor and including a first terminal, a second terminal, and an insulation layer interposed between the first and second terminals, at least the insulation layer disposed on the second side of the substrate;
wherein the first terminal includes an interconnect structure disposed directly over the insulation layer on the second side, wherein the insulation layer has a width less than a width of a bottom surface of the interconnect structure, and wherein the transistor and the capacitor form a one-time programmable (OTP) memory cell.

2. The memory device of claim 1, further comprising a via structure disposed on the second side and disposed over a source/drain structure of the transistor, wherein the insulation layer is disposed below the via structure.

3. The memory device of claim 2, wherein the via structure is electrically connected to the source/drain structure and functions as the first terminal, and the interconnect structure functions as the second terminal.

4. The memory device of claim 2, wherein the source/drain structure functions as at least a portion of the first terminal, and the via structure functions as the second terminal.

5. The memory device of claim 1, further comprising:
a plurality of via structures on the second side; and
a plurality of interconnect structures on the second side;
wherein the plurality of via structures and the plurality of interconnect structures are each configured to electrically couple a source/drain structure of the transistor to a bit line through the insulation layer.

6. The memory device of claim 5, wherein a first one of the plurality of via structures is in direct contact with the source/drain structure and a first one of the plurality of interconnect structures is in direct contact with the first via structure, wherein the insulation layer is in direct contact with the first interconnect structure, and wherein remaining ones of the via structures and remaining ones of the interconnect structures disposed between the insulation layer and the bit line.

7. The memory device of claim 5, wherein a first one of the plurality of via structures is in direct contact with the source/drain structure, a first one of the plurality of interconnect structures is in direct contact with the first via structure, a second one of the plurality of via structures is in direct contact with the first interconnect structure, and the insulation layer is in direct contact with the second via structure and a second one of the interconnect structures.

8. The memory device of claim 5, wherein a first one of the plurality of via structures is in direct contact with the source/drain structure, a first one of the plurality of interconnect structures in in direct contact with the first via structure, a first portion of a second one of the plurality of via structures is in direct contact with the first interconnect structure, and wherein the first and second portions of the second via structure are disposed on opposite sides of the insulation layer.

9. The memory device of claim 1, wherein the OTP memory cell includes an antifuse cell, and wherein the insulation layer of the capacitor of the OTP memory cell is configured to be irreversibly broken down.

10. A memory array, comprising:
a substrate; and
a plurality of one-time programmable (OTP) memory cells disposed over the substrate, each OTP memory cell comprising:
a transistor disposed on a substrate and having a source/drain terminal;
a plurality of via structures disposed below the source/drain terminal of the transistor;

a plurality of interconnect structures disposed below the source/drain terminal of the transistor, where one of the plurality of interconnect structures is interposed between adjacent via structures of the plurality of via structures; and an insulation layer interposed between a first via structure of the plurality of via structures and a first interconnect structure of the plurality of interconnect structures, wherein the insulation layer is disposed directly below the first interconnect structure.

11. The memory array of claim 10, wherein the insulation layer is disposed on a top surface of the first via structure, and wherein the insulation layer is disposed on a bottom surface of the source/drain terminal of the transistor.

12. The memory array of claim 10, wherein a width of the insulation layer is greater than a width of a bottom surface of the first via structure.

13. The memory array of claim 10, wherein a width of the insulation layer is substantially the same as a width of a bottom surface of the first via structure.

14. The memory array of claim 10, wherein a width of the insulation layer is less than a width of a bottom surface of the first interconnect structure.

15. The memory array of claim 10, wherein a width of the insulation layer is substantially the same as a width of a bottom surface of the first interconnect structure.

16. A memory array, comprising:
a plurality of one-time programmable (OTP) memory cells, each OTP memory cell comprising:
a first active region comprising a plurality of source/drain structures;
an interconnect structure disposed below the first active region, wherein at least one of the plurality of source/drain structures is electrically coupled to the interconnect structure; and
an insulation layer disposed between the plurality of source/drain structures and the interconnect structure, wherein the insulation layer is directly above the interconnect structure and has a width less than a width of the interconnect structure.

17. The memory array of claim 16, wherein the insulation layer has one or more materials selected from a group consisting of: titanium nitride (TiN), tantalum nitride (TaN), an alloy of Ti and TiN, an alloy of Ta and TaN, an alloy of aluminum (Al) and oxygen (O), and combinations thereof.

18. The memory array of claim 16, further comprising a plurality of via structures disposed below the first active region.

19. The memory array of claim 16, where the interconnect structures is interposed between adjacent via structures of the plurality of via structures.

* * * * *